US008754704B2

(12) United States Patent
Huang

(10) Patent No.: US 8,754,704 B2
(45) Date of Patent: Jun. 17, 2014

(54) THROUGH-SILICON VIA SELF-ROUTING CIRCUIT AND ROUTING METHOD THEREOF

(71) Applicant: National Changhua University of Education, Changhua (TW)

(72) Inventor: Tsung-Chu Huang, Changhua (TW)

(73) Assignee: National Changhua University of Education, Changhua (TW)

( * ) Notice: Subject to any disclaimer, the term of this patent is extended or adjusted under 35 U.S.C. 154(b) by 0 days.

(21) Appl. No.: 13/845,059

(22) Filed: Mar. 17, 2013

(65) Prior Publication Data

US 2014/0111269 A1    Apr. 24, 2014

(30) Foreign Application Priority Data

Oct. 24, 2012    (TW) .............................. 101139290 A

(51) Int. Cl.
*H01L 25/00*    (2006.01)
(52) U.S. Cl.
USPC ........................................................ 327/565
(58) Field of Classification Search
USPC .................................................. 327/564–565
See application file for complete search history.

(56) References Cited

U.S. PATENT DOCUMENTS

| 8,242,589 B2 * | 8/2012 | Saen et al. ..................... 257/686 |
| 2010/0060310 A1 | 3/2010 | Laisne et al. |
| 2013/0207685 A1 * | 8/2013 | Ku ............................ 324/762.01 |

OTHER PUBLICATIONS

Cost Effectiveness of 3D Integration Options.
TSV Redundancy: Architecture and Design Issues in 3-D IC.
Routing for moore.
Novel Design of Three-Dimensional Crossbar for Future Network on Chip based on Post-Silicon Devices.
Micronetworking: reliable communication on 3D integrated circuits.

* cited by examiner

*Primary Examiner* — Quan Tra
(74) *Attorney, Agent, or Firm* — CKC & Partners Co., Ltd.

(57) ABSTRACT

A through-silicon via self-routing circuit includes a plurality of through-silicon vias (TSVs) and a plurality of planar die. The plurality of planar die are connected by the plurality of TSVs. And each one of the plurality of planar die includes a built-in self-tester, a built-in self-routing switching network, and a core circuit. The built-in self-tester has a plurality of valid-bit leads and a plurality of through-silicon via leads to connect the plurality of TSVs. The built-in self-routing switching network is connected to the built-in self-tester, for selecting from the plurality of TSVs for conducting. The core circuit has a to plurality of I/O leads linked to the built-in self-routing switching network.

7 Claims, 8 Drawing Sheets

THROUGH-SILICON VIA SELF-ROUTING CIRCUIT AND ROUTING METHOD THEREOF

RELATED APPLICATIONS

This application claims priority to Taiwan Application Serial Number 101139290, filed Oct. 24, 2012, which is herein incorporated by reference.

BACKGROUND

1. Field of Disclosure

The present disclosure relates to three-dimensional integrated circuit. More particularly, the present disclosure relates to a through-silicon via self-routing circuit and a routing method' thereof.

2. Description of Related Art

As the people's need and the requirement to the electronic technology are increasing, intelligent electronics IE) draws more and more attention from global everywhere. To follow the more and more rigorous standard for integrated circuit (IC), and to achieve higher speed, lower power, smaller size, and bigger storage, three-dimensional (3D) IC is the main approach for this field.

Among the filed of IE, memory is not only the essential component for 3C products or automotive electronics, but also the indispensable component for biomedical electronics. As the scale of data and intelligence grows larger and larger rapidly, the storage requirement for memory thus grows bigger and bigger quickly.

On the other hand, memory is also suit for adopting 3D IC. In the fierce competition of 3D IC market, Micron Technology, Inc. developed Hybrid Memory Cube (HMC), and HMC turns into the brand new structure of memory development. The efficiency of saving energy under HMC structure can be 7 times the modern third generation of double-data-rate three dynamic random access memory (DDR3-DRAM). The concept of HMC is to employ a configuration of vertical stack-based memory allocation, to form a micro-cube chip. HMC also employs an innovative high-speed interface to build a new standard of energy saving efficiency in data transfer, and the transfer speed can as achieve the level of 1 terabit per second. The development of HMC can greatly improve the development of the cloud computing servers, ultra-book laptops, televisions, tablet computers, and smart phones.

On December 2010, Samsung Electronics Co., Ltd. also announced its 8 GB DDR3-DRAM module developed by 3D chip stacking technology, which is also referred to as through silicon via (TSV). The 8 GB DDR3-DRAM module consisted of two 4 GB chips. Samsung Electronics Co., Ltd. again announced its 32 GB DDR3-DRAM module developed by TSV on August 2011. On 6 Dec. 2011, Taiwan's Industrial Technology Research Institute (ITRI) and Intel Corporation signed an agreement to jointly develop next-generation memory devices. In view of the above, memory devices with high yield rate and high energy-efficiency is very important to the future world. However, there are still many difficulties regarding 3D IC development. For instance, the yield rate of memory is generally around 20%, which is not good. The yield rates of silicon interposer and TSV are not good either.

3D IC is a chip in which multiple tiers of active electronic components are integrated into a single circuit, by thinning, bonding, and TSVs, to turn conventional 2D planar chip into the form of 3D stack. Before the complete 3D IC technique is presented to the public, there are many manufacturing technologies in the prior art, such as Package on Package (PoP), Multi-Chip Package (MCP), and 2.5D stacks for being between 2D chips and 3D chip stacks. Therefore, the TSV interconnection between two tiers can be achieved through several TSVs, flip-chip bumps, micro-bumps, interposers, or package bumps. Before further introducing TSV Redundancy Analysis, a principle is to generally adopted and should be stated: Two adjacent tiers are simplified as a TSV, and every TSV among a vertical lead can be repaired separately.

Recent implementations for TSV Redundancy Analysis are mostly done by switching circuits. Some technologies are described as below.

Crossbar-based 3D Network: As shown in FIG. 1A, a conventional M-to-N crossbar switch network can completely select N paths from M TSVs with at most M-N defected TSVs but it is usually utilized in a small group due to switch overhead in O(MN) and high branch effort in O(N). In 2006 $1^{st}$ International Conference on Nano-Networks, Nomura, K., et al. thus published 'Novel design of three-dimensional crossbar for future network on chip based on post-silicon devices,' (Nomura, K., et al.: 'Novel design of three-dimensional crossbar for future network on chip based on post-silicon devices'. Int. Conf. Nano-Networks, Lausanne, Switzerland, 2006) provided a strategy of grouping TSVs.

Neighbor-Shift Scheme: To avoid multiple switching causing TSV signal delay, Laisne, M., Arabi, K., and Petrov, T issued a US patent of 'Systems and Methods Utilizing Redundancy in Semiconductor Chip Interconnects,' (Laisne, M., Arabi, K., and Petrov, T.: 'Systems and Methods Utilizing Redundancy in Semiconductor Chip Interconnects', U.S. Patent 61/095,855, Sep. 10, 2008) providing a neighbor-shift manner as shown in FIG. 1B. The benefit for this approach is that only two switching delay are required between two tiers. The downside, however, is that only one single TSV fault is repairable.

Micro-Networking: In 2010, Contreras, A. A., Moon, T. K Dasu, A., and Gunther, J. H. published a paper of 'Micronetworking: reliable communication on 3D integrated circuits' (Contreras, A. A. Moon, T. K., Dasu, A., and Gunther, J. H.: 'Micronetworking: reliable communication on 3D integrated circuits', Electron. Lett., 2010, 46, (4), pp. 291-293). For a given example shown in FIG. 1C, while there are k=4 tracks needed for every tier, a switching box as shown in FIG. 5$d$ is required. And there are 18 transmission gates needed for the switching box of FIG. 5$d$. In the worst case, the routing passes 4(M-1)+2k transmission gates, and there are 2k transmission gates needed. The micronetworking compromises the area overhead and the fault multiplicity but only 2k faulty TSVs can be repaired from M TSVs in the worst case, when the micronetworking is constructed with k tracks and (4k+2) M switches per tier.

On the other hand, in 2010, Hsieh, k-C., and Hwang, T. published another paper of 'TSV redundancy: architecture and design issues in 3D IC.' (Hsieh, A.-C., and Hwang, T.: 'TSV redundancy: architecture and design issues in 3D IC', IEEE Trans. Very Large Scale Integr. (VLSI) Syst., 2012, 20, (4), pp. 711-722). In this paper, Neighbor-Shift Scheme can be modified into TSV Chain, which can be considered as a special case whereas k=1.

Every conventional technology has its own view and theory about the repair rate of TSVs, since adopting different fault calculating model. The repair rate of single-TSV fault of all above mentioned technologies are 100%. But if there are more than one single TSV fault occurred, the repair rate of Neighbor-Shift Scheme is 0%, while the repair rate of Micro-Networking can be 100% if the number of defected TSVs F<2k, and the repair rate of Crossbar-based 3D Network can be 100% if the number of defected TSVs F≤(M-N). Neighbor-Shift Scheme technology would be no use if the number of defected TSVs is more than one. Micro-Networking and Crossbar-based 3D to Network technologies can repair multiple defected TSVs. However, the routing control for Micro-Networking or Crossbar-based 3D Network is difficult to integrated with 3D IC design and test flow, so that the design and production costs for adopting these technologies are high.

SUMMARY

According to one aspect of the present disclosure, a through-silicon via self-routing circuit includes a plurality of through-silicon vias and a plurality of planar die. The plurality of planar die are connected by the plurality of through-silicon vias, Every planar die further comprises a built-in self-tester, a built-in self-routing switching network, and a core circuit. The built-in self-tester has a plurality of valid-bit leads and a plurality of through-silicon via leads to connect the plurality of through-silicon vias. The built-in self-routing switching network is connected to the built-in self-tester. The built-in self-routing switching network selects from the plurality of through-silicon vias for conducting. The core circuit has a plurality of 110 leads linked to the built-in self-routing switching network.

According to another aspect of the present disclosure, a routing method applying to the foregoing through-silicon via self-routing circuit includes the following steps in order: A priority of the core circuit is decided. The plurality of through-silicon vias is tested by the built-in self-tester. The built-in self-tester produces a plurality of valid bits, which are matched to linking the plurality of through-silicon vias. The built-in self-routing switching network selects good through-silicon vias from the plurality of through-silicon vias and to links the good through-silicon vias to the core circuit.

In the following description, the merits of cost efficiency and easy-to-build structure will be shown regarding the present disclosure. The advantage of the present disclosure is when the number of defected TSVs is at most M-N, the repair rate thereof is 100%, which is the best repair rate compared to all prior arts.

In view of the above, the advantages of the present disclosure are:

When the TSVs are defected, the claimed invention could automatically select redundant back-up TSVs through the built-in self-routing switching network and apply to the self-repair of the TSVs. And the structure of present disclosure is more simplified and regular contrast to the conventional techniques, and can be easily integrated with 3D IC design and test flows. At the same time, the number of necessary electronic components can be reduced, and the production cost can be reduced as a result.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1B:
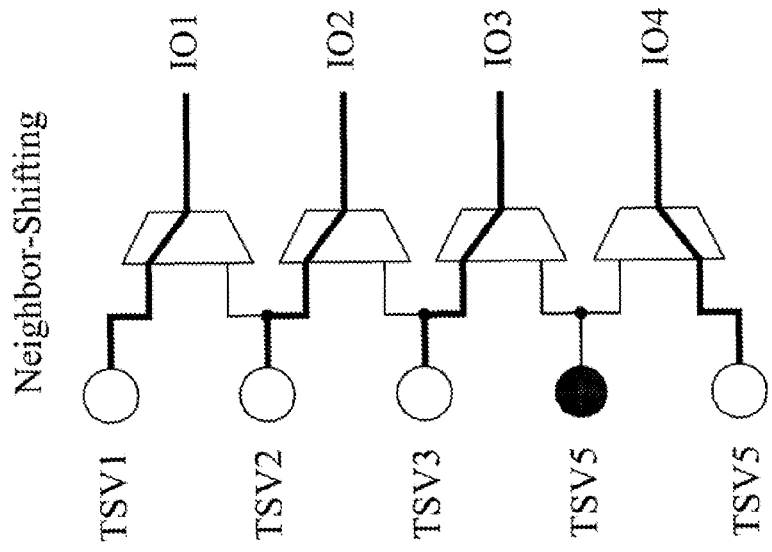
FIG. 1B is a circuit diagram of a conventional Neighbor-Shift Scheme
Figure 1A:
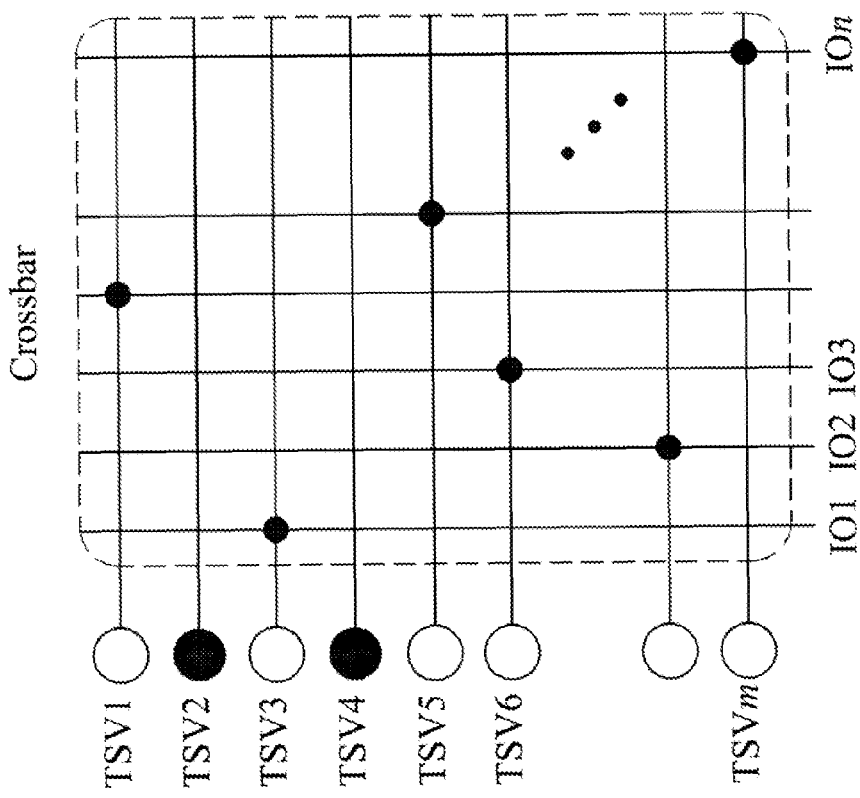
FIG. 1A is a circuit diagram of a conventional Crossbar-based 3D to Network.
Figure 1C:
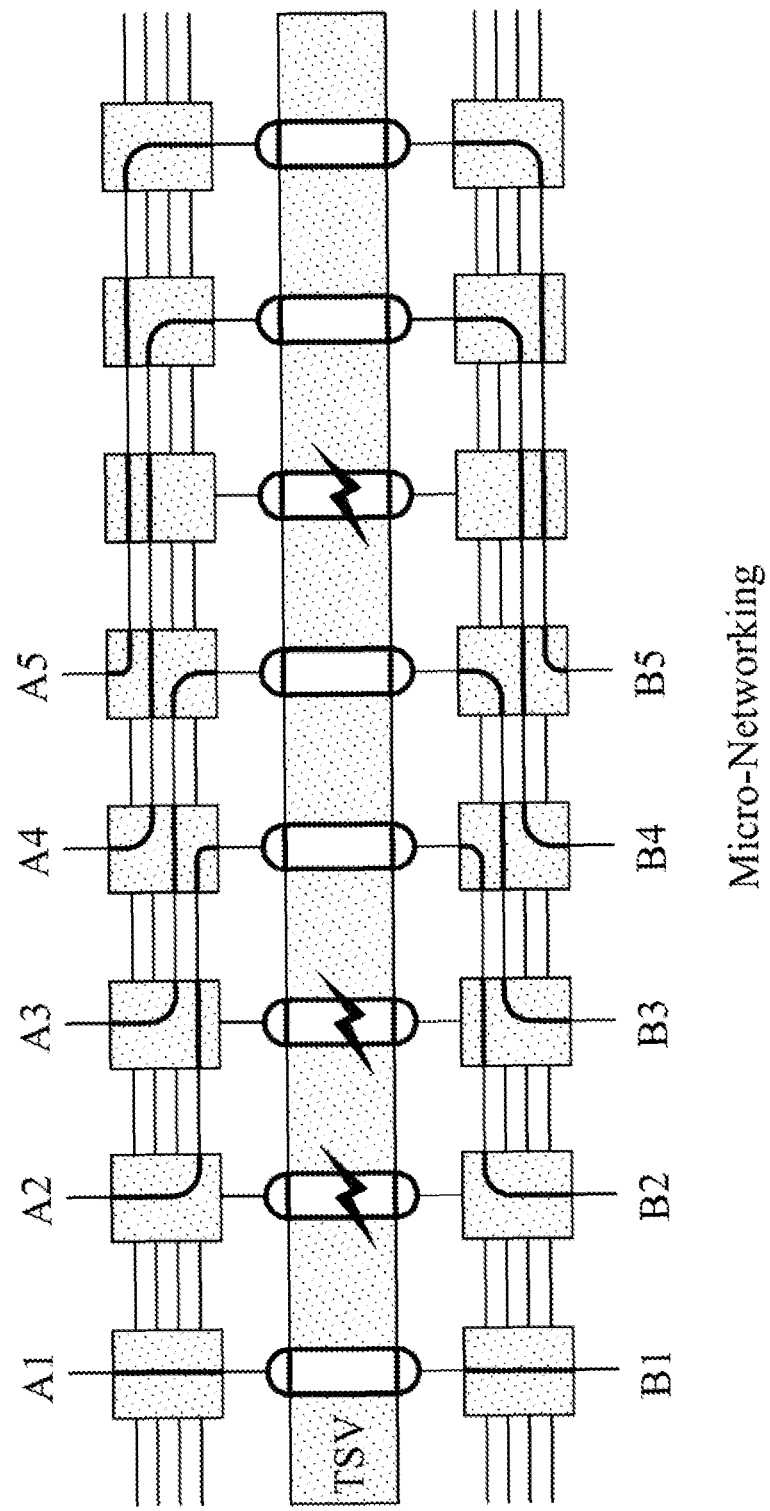
FIG. 1C is a circuit diagram of a conventional Micro-Networking.
Figure 1D:
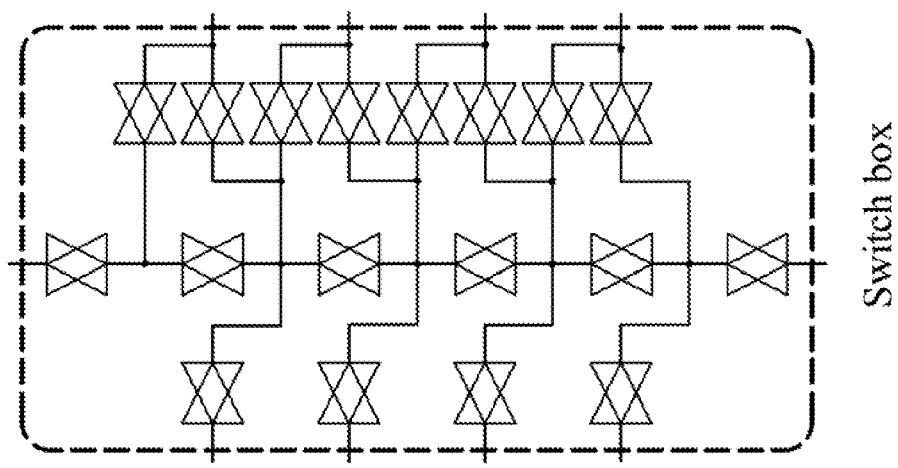
FIG. 1D is a circuit diagram of a conventional switching box.

Reference will now be made in detail to the present embodiments of the disclosure, examples of which are illustrated in the accompanying drawings. Wherever possible, the same reference numbers are used in the drawings and the description to refer to the same or like parts.

Figure 2:
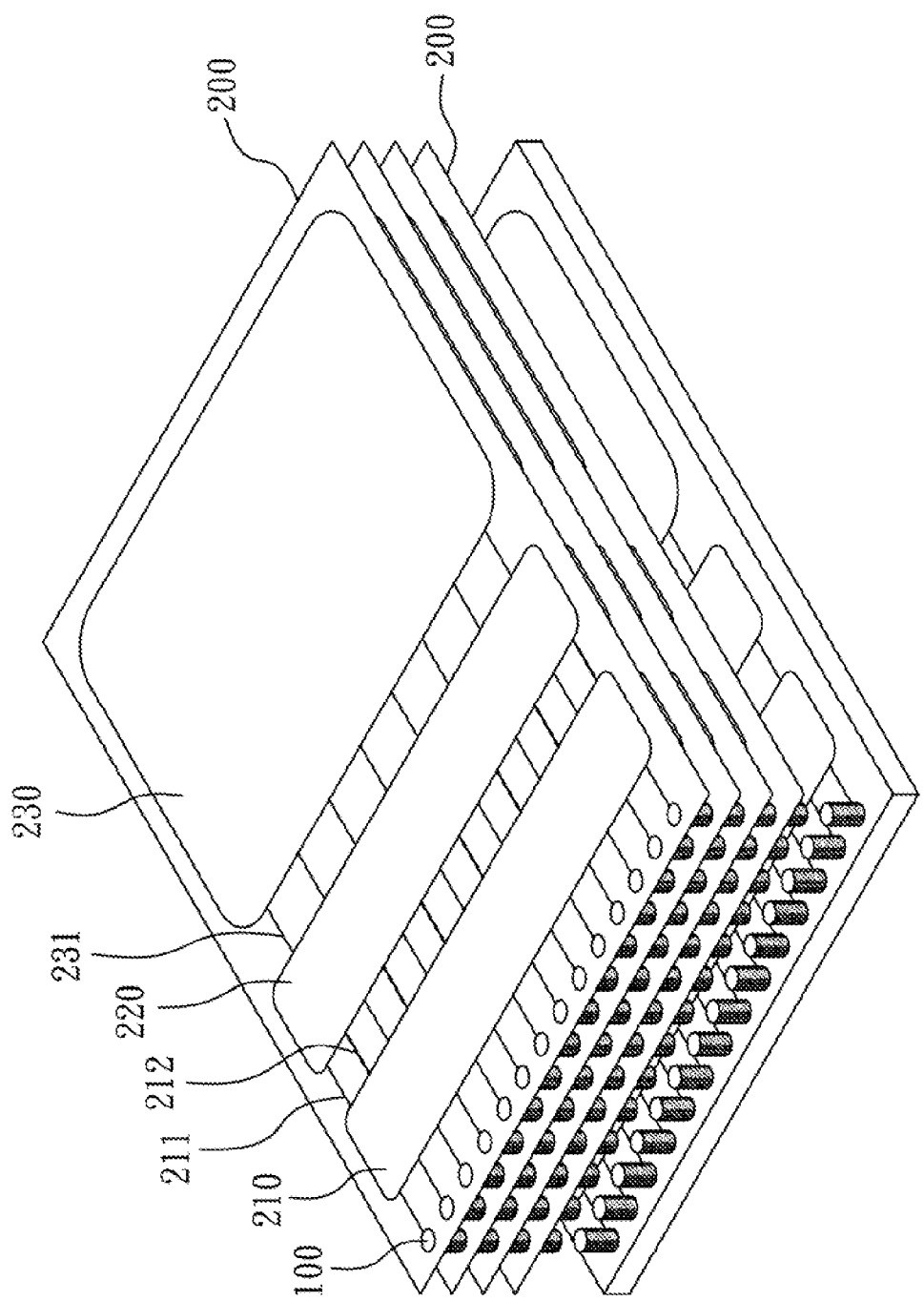
FIG. 2 is a schematic diagram and a perspective view of a through-silicon via self-routing circuit according to one embodiment of this disclosure.

FIG. 2 is a schematic diagram and a perspective view of a through-silicon via (TSV) self-routing circuit according to one embodiment of this disclosure. A TSV self-routing circuit includes a plurality of TSVs 100 and a plurality of planar die 200. The plurality of planar die 200 are connected via the plurality of TSVs 100. Every planar die 200 further comprises a built-in self-tester 210, a built-in self-routing switching network 220, and a core circuit 230. The built-in self-tester 210 has a plurality of valid-bit leads 211 and a plurality of TSV leads 212 to connect the plurality of TSVs 100. The built-in self-routing switching network 220 is connected to the built-in self-tester 210 via the plurality of valid-bit leads 211 and the plurality of TSV leads 212. The built-in self-routing switching network 220 selects good TSVs from the plurality of TSVs 100 for conducting. The core circuit 230 has a plurality of I/O leads 231 linked to the built-in self-routing switching network 220.

Figure 3:
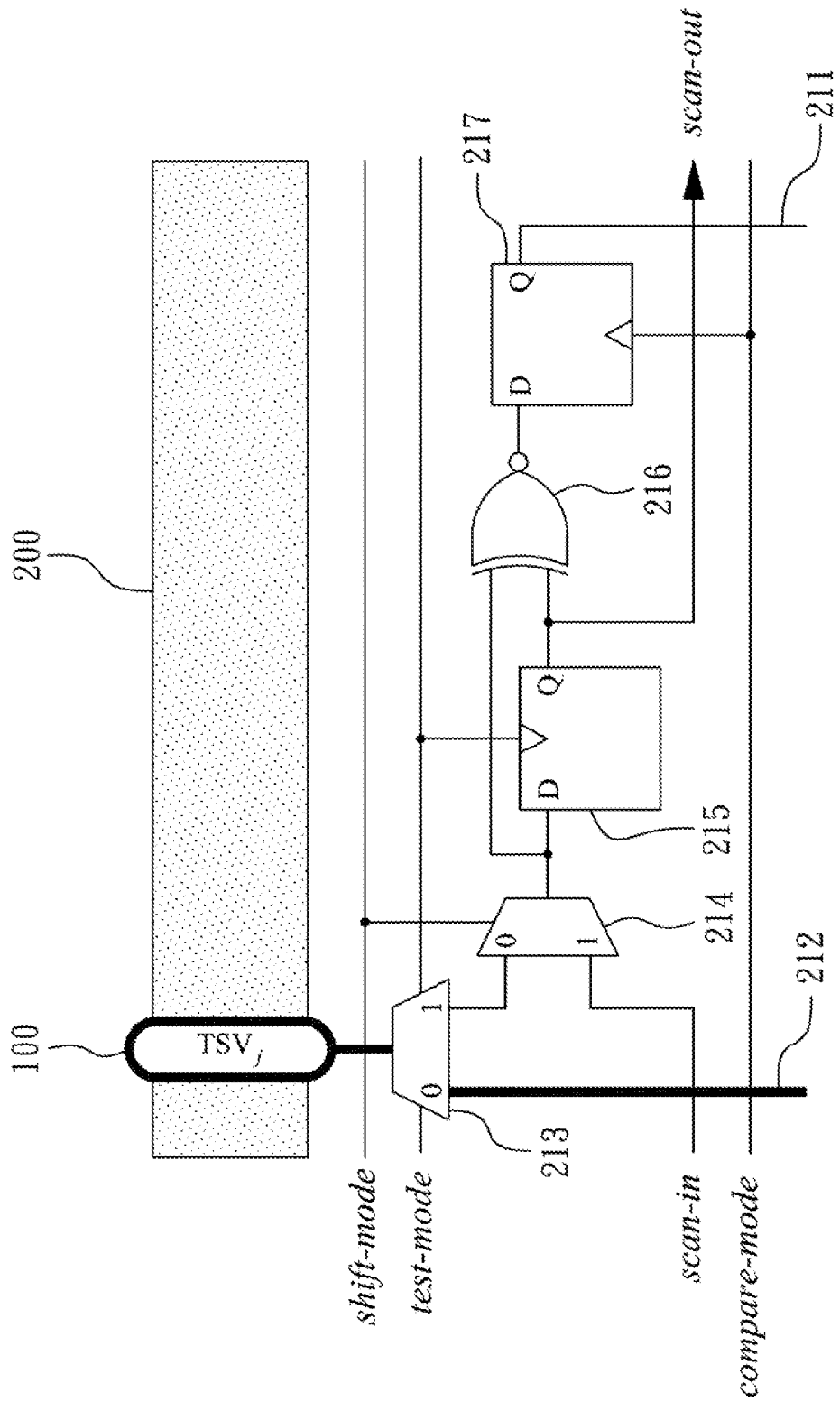
FIG. 3 is a schematic diagram of a built-in self-tester according to one embodiment of this disclosure.

FIG. 3 is a schematic diagram of the built-in self-tester 210 according to the above embodiment of this disclosure. The built-in self-tester 210 can further includes a first multiplexer 213, a second multiplexer 214, a first flip-flop 215, an XNOR gate 216, and a second flip-flop 217. The first multiplexer 213 is connected to one of the TSVs 100 and one of the TSV leads 212. The second multiplexer 214 is connected to the first multiplexer 213. The first flip-flop 215 is connected to the second multiplexer 214. The XNOR gate 216 is connected to the first flip-flop 215. The second flip-flop 217 is connected to the XNOR gate 216 and one of the valid-bit leads 211.

When operating in normal mode, based on a priority of the core circuit 230, the first multiplexer 213 is controlled by a test-mode, which is set by the output signals of the core circuit 230. So the first multiplexer 213 can select from TSV leads 212 or the test-mode. When operating in test mode, the second multiplexer 214 is controlled by a shift-mode, which is set by the output signals of the core circuit 230. The second multiplexer 214 is for selecting TSVs from the TSVs which passed the test to receive signals, and storing the signal at the first flip-flop 215. When operating in scan mode, the scanning information from the scan-in of the previous circuit level can be stored in the first flip-flop 215 and the scanning information can be passed to next circuit level from the scan-out of the first flip-flop 215. When the inputted test vector reached the other end of the TSV 100, the correct vector also scanned the previous circuit level of the built-in self-tester 210. Through a capture-mode of the control' signals, and based on the comparing test result from the XNOR gate 216 retrieved by the second flip-flop 217, the validation of every TSV can be determined. If the comparing test result from the XNOR gate 216 is '1', then the TSV is valid, or vise versa.)

Figure 4:
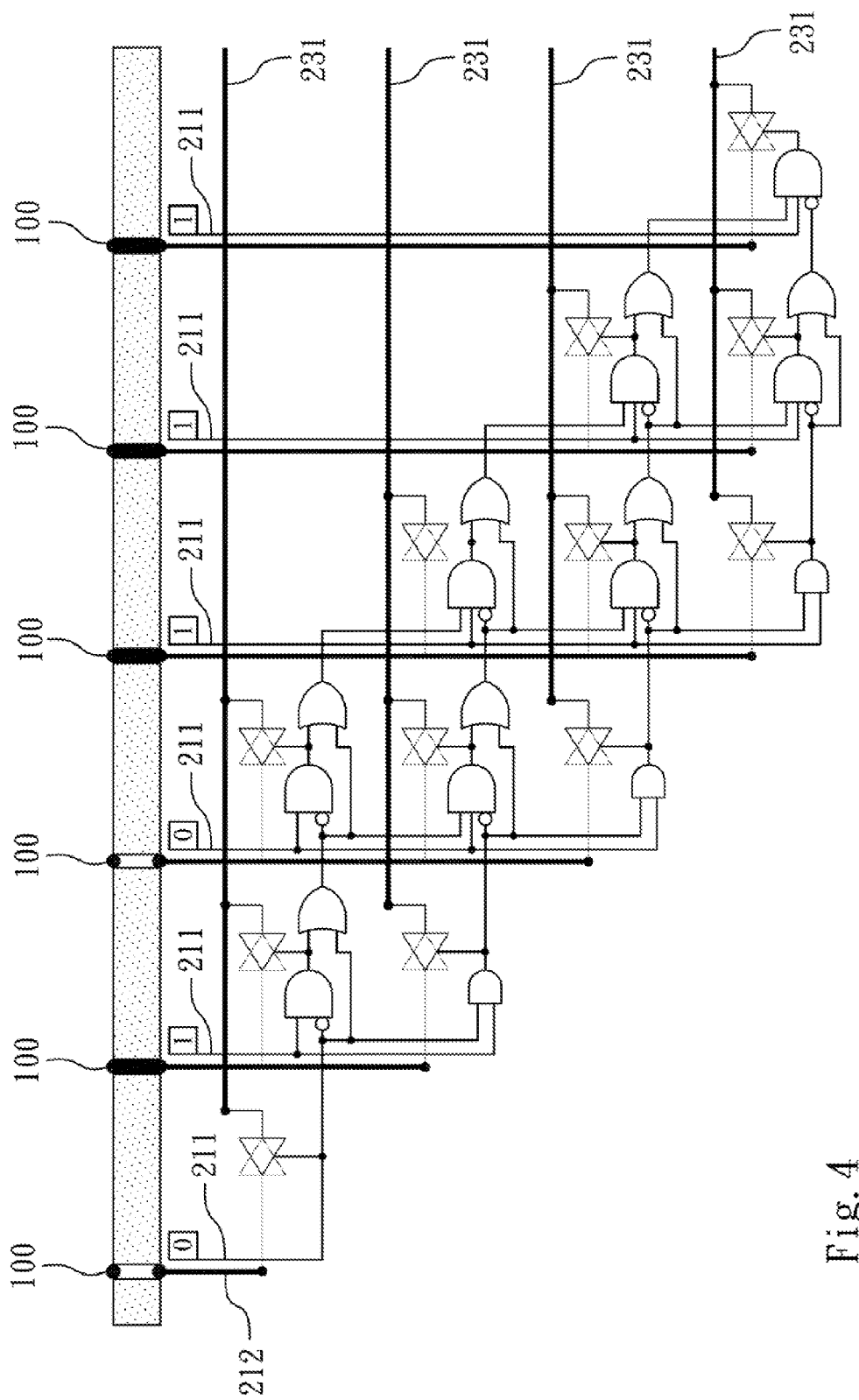
FIG. 4 is a schematic diagram of a built-in self-routing switching network according to one embodiment of this disclosure.
Figure 5:
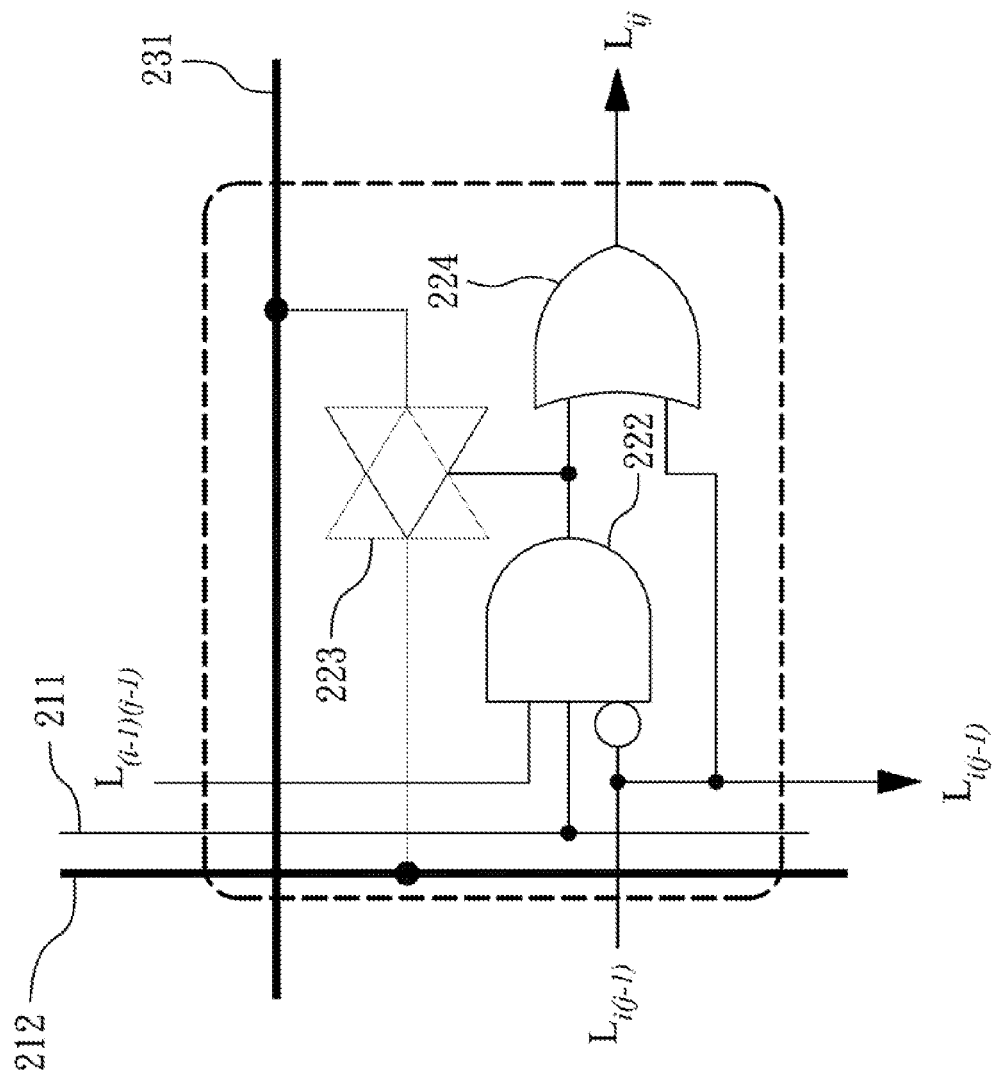
FIG. 5 is a schematic diagram of a switching cell according to one embodiment of this disclosure.
Figure 6:
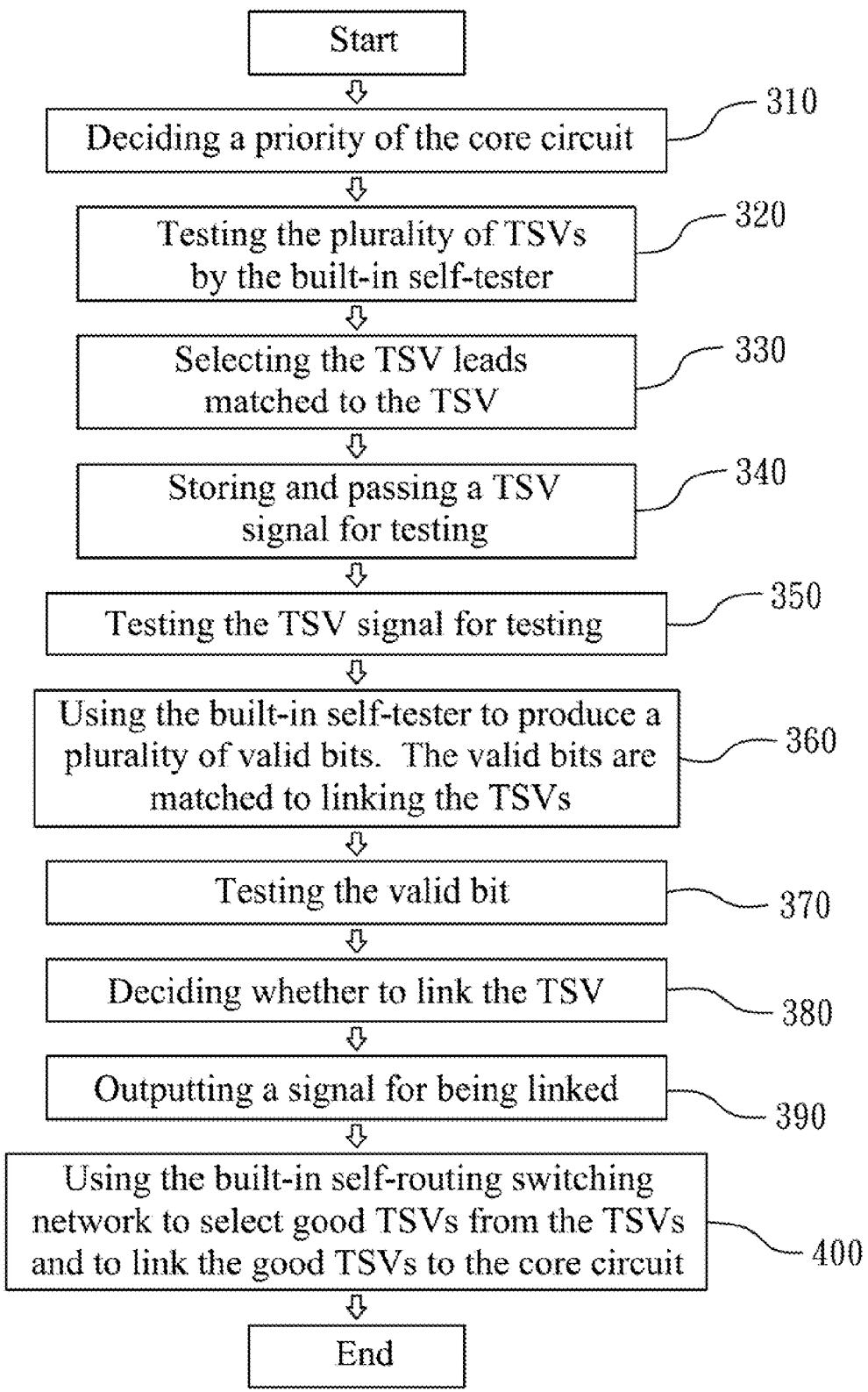
FIG. 6 is a flowchart showing a routing method for the through-silicon via self-routing circuit according to another embodiment of this disclosure.

FIG. 4 is a schematic diagram of the built-in self-routing switching network 220, and FIG. 5 is a schematic diagram of a switching cell 221 according to one embodiment of this disclosure. The built-in self-routing switching network 220 can further includes a switching cell 221, which is constructed in the form of an iterative logic array. The switching cell 221 can further include an AND gate 222, a switch 223, and a OR gate 224. The AND gate 222 is connected to one of the valid-bit leads 211, to receive the signal from previous circuit level and to decide whether to open the switch 223. The switch 223 is connected to the AND gate 222, one of the TSV leads 212, and one of the I/O leads 231. When the decision of closing (conducting) the switch 223 is made, the TSV 100 can be connected to the core circuit 230 by the I/O lead 231. The OR gate 224 is connected to the switch 223 and the AND gate 222. The OR gate 224 is for receiving the signal from previous circuit level and from the AND gate 222, and for rightwardly transmitting a signal of a switch 223 positioned at left being conducted. The signal $L_{ij}$, shown in FIG. 5 represents the conducting status of to the i-th row and j-th column.

Fig, 6 is a flowchart showing a routing method for the foregoing through-silicon via self-routing circuit according to another embodiment of this disclosure. Step 310 is deciding a priority of the core circuit. Step 320 is testing the plurality of TSVs by the built-in self-tester. Step 330 is selecting the TSV leads matched to the TSV. Step 340 is storing and passing a TSV signal to be tested. Step 350 is testing the TSV signal to be tested. Step 360 is using the built-in self-tester to produce a plurality of valid bits. The valid bits are matched to linking the TSVs. Step 370 is testing the valid bit. Step 380 is deciding whether to link the TSV. Step 390 is outputting a signal for being linked. Step 400 is using the built-in self-routing switching network to select good TSVs from the TSVs and to link the good TSVs to the core circuit.

According to the foregoing embodiment and example, the advantages of the present disclosure are described as follows.

1. When there are defected TSVs, through selecting good TSVs by the built-in self-routing switching network, or through detecting the fault rate of the TSVs and automatically selecting redundant back-up TSVs, such that the core circuit can use the redundant TSVs.

2. Comparing with prior arts, the disclosure presents a simplified and regular structure that can be potentially and easily integrated with the state-of-the-art 3D IC design and test flows. The disclosure can also greatly improve repair rate, lower performance impact and reduce the area overhead of the control logics. Especially, no extra repairing architecture or built-in redundancy analysis is required due to its self-routability. Furthermore, less necessary components are required and the production cost is lowered It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fail within the scope of the following claims.

What is claimed is:
1. A through-silicon via self-routing circuit comprising:
a plurality of through-silicon vias; and
a plurality of planar die, connected by the plurality of through-silicon vias, each one of the plurality of planar die comprising:
a built-in self-tester, having a plurality of valid-bit leads and a plurality of through-silicon via leads to connect the plurality of through-silicon vias;
a built-in self-routing switching network, connected to the built-in self-tester, whereby the built-in self-routing switching network selects from the plurality of through-silicon vias for conducting; and
a core circuit, having a plurality of I/O leads linked to the built-in self-routing switching network.

2. The through-silicon via self-routing circuit of claim 1, wherein the built-in self-tester further comprising:
a first multiplexer, connected to one of the plurality of through-silicon vias and one of the plurality of through-silicon via leads;
a second multiplexer, connected to the first multiplexer;
a first flip-flop, connected to the second multiplexer;
an XNOR gate, connected to the first flip-flop; and
a second flip-flop, connected to the XNOR gate and one of the plurality of valid-bit leads.

3. The through-silicon via self-routing circuit of claim 1, wherein the built-in self-routing switching network further comprising:
a switching cell, comprising:
an AND gate, connected to one of the plurality of valid-bit leads;
a switch, connected to the AND gate, one of the plurality of through-silicon via leads, and one of the plurality of I/O leads; and
a OR gate, connected to the switch and the AND gate.

4. The through-silicon via self-routing circuit of claim 3, wherein the switching cell is an iterative logic array.

5. A routing method, applying to the through-silicon via self-routing circuit of claim 1, the routing method comprising the steps in the order of:
deciding a priority of the core circuit;
testing the plurality of through-silicon vias by the built-in self-tester;
using the built-in self-tester to produce a plurality of valid bits, which are matched to linking the plurality of through-silicon vias; and
using the built-in self-routing switching network to select good through-silicon vias from the plurality of through-silicon vias and to link the good through-silicon vias to the core circuit.

6. The routing method of claim 5, wherein the step of testing the plurality of through-silicon vias by the built-in self-tester further comprising:
selecting the through-silicon via leads matched to the through-silicon via;
storing and passing a through-silicon via signal to be tested; and
testing the through-silicon via signal to be tested.

7. The routing method of claim 5, wherein the step of using the built-in self-routing switching network to select good through-silicon vias from the plurality of through-silicon vias and to link the good through-silicon vias to the core circuit comprising:
testing the valid bit;
deciding whether to link the through-silicon via; and
outputting a signal for being linked.

* * * * *